United States Patent [19]

Nakamura et al.

[11] Patent Number: 5,462,918
[45] Date of Patent: Oct. 31, 1995

[54] SUPERCONDUCTING FIELD EFFECT DEVICE WITH VERTICAL CHANNEL FORMED OF OXIDE SUPERCONDUCTOR MATERIAL

[75] Inventors: Takao Nakamura; Hiroshi Inada; Michitomo Iiyama, all of Osaka, Japan

[73] Assignee: Sumitomo Electric Industries, Ltd., Japan

[21] Appl. No.: 249,478

[22] Filed: May 26, 1994

Related U.S. Application Data

[63] Continuation of Ser. No. 784,934, Oct. 31, 1991, abandoned.

[30] Foreign Application Priority Data

| Oct. 31, 1990 | [JP] | Japan | 2-294290 |
| Oct. 31, 1990 | [JP] | Japan | 2-294291 |
| Oct. 31, 1990 | [JP] | Japan | 2-294292 |
| Oct. 31, 1990 | [JP] | Japan | 2-294293 |

[51] Int. Cl.$^6$ ............... H01B 12/00; H01L 39/22; B05D 5/12
[52] U.S. Cl. ............... 505/193; 257/38; 257/39; 257/263; 505/234; 505/237; 505/239
[58] Field of Search ............... 505/1, 190–193, 505/234–238, 239, 700–703; 357/5, 23.4; 427/62, 63; 257/33, 35, 39, 267, 266, 36–39, 266, 267

[56] References Cited

U.S. PATENT DOCUMENTS 4,677,451  6/1987  Parsons et al. ............... 257/267
4,831,421  5/1989  Gallagher et al. ............... 357/5

FOREIGN PATENT DOCUMENTS 61-179583  8/1986  Japan ............... 357/5
01268075  10/1989  Japan ............... 357/5
01308086  12/1989  Japan ............... 357/5

OTHER PUBLICATIONS

Linker et al, "Control Of Growth Direction Of Epitaxial y–Ba–Cu–O Thin Films On SrTi–O3 Substratges", Solid State Communications, vol. 69, #3, 1989 pp. 249–253.

*Primary Examiner*—Mahshid D. Saadat
*Attorney, Agent, or Firm*—Beveridge, DeGrandi, Weilacher & Young

[57] ABSTRACT

A superconducting device has a stacked structure including a first superconducting layer, a first insulating layer, a second superconducting layer, a second insulating layer and a third superconducting layer stacked on a substrate in this given order. The stacked structure has an end surface portion extending from the first insulating layer to the second insulating layer. A fourth superconducting layer is formed to cover the end surface of the stacked structure. A third insulating layer separates the stacked structure end surface and the fourth superconducting layer. The fourth superconducting layer is electrically connected to the first and third superconducting layers but is isolated from the second superconducting layer by the third insulating layer. The first through fourth superconducting layers are formed of an oxide superconductor thin film. A silicon containing layer is formed adjacent to at least one of the first, third and fourth superconducting layers, but is not in direct contact with the other superconducting layers.

13 Claims, 2 Drawing Sheets

SUPERCONDUCTING FIELD EFFECT DEVICE WITH VERTICAL CHANNEL FORMED OF OXIDE SUPERCONDUCTOR MATERIAL

This application is a continuation, of application No. 07/784,934, filed Oct. 31, 1991, now abandoned which application is entirely incorporated herein by reference.

BACKGROUND OF THE INVENTION

1. Field of the Invention

The present invention relates to a superconducting device, and more specifically to a superconducting device formed of an oxide superconductor thin film formed on a substrate and having a structure suitable to be assembled in an integrated circuit.

2. Description of Related Art

Typical devices utilizing a superconductor include a so called Josephson device, which comprises a pair of superconductors coupled to each other through a tunnel barrier. The Josephson device can realize a high speed switching. However, the Josephson device is a two-terminal device, and therefore, requires a complicated circuit in order to realize a logic circuit.

On the other hand, typical three-terminal devices utilizing a superconductor include a so called superconducting-base transistor and a so called super-FET (field effect transistor). The superconducting-base transistor includes a tunnel barrier and a base of a superconductor, and can operate at a high speed with a low power consumption, by utilizing high speed electrons passing through the tunnel barrier.

The super-FET is so constructed that a superconducting current flowing through a semiconductor layer portion between a superconductor source electrode and a superconductor drain electrode due to a proximity effect is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

However, the above mentioned conventional superconducting devices do not pay attention to integration of superconducting devices. If the above mentioned superconducting devices are applied or used in electronic instruments, it is required to be not only possible to integrate the device or elements but also easy to modify the circuit and to omit a defective element. In addition, in the case that superconducting devices are integrated, it is also required to be capable of realizing a high integration density and of easily planarizing the superconducting devices assembled in the integrated circuit.

SUMMARY OF THE INVENTION

Accordingly, it is an object of the present invention to provide a superconducting device which has overcome the above mentioned defect of the conventional one.

Another object of the present invention is to provide a superconducting device which can easily pattern, semicustomize and modify a circuit including the superconducting device, and which can remove a defective superconducting device included in the circuit.

Still another object of the present invention is to provide a superconducting device which is simple in construction and which can realize a high integration density and can easily planarize the superconducting devices when assembled in the integrated circuit.

The above and other objects of the present invention are achieved in accordance with the present invention by a superconducting device comprising a stacked structure composed of a first superconducting layer, a first insulating layer, a second superconducting layer, a second insulating layer and a third superconducting layer stacked on a substrate in the named order, the stacked structure having an end surface extending from the first insulating layer to the second insulating layer, a fourth superconducting layer formed to cover the end surface of the stacked structure through a third insulating layer, the four superconducting layer being in electric connection to the first and third superconducting layer but isolated from the second superconducting layer by the third insulating layer, the first to fourth superconducting layers being formed of an oxide superconductor thin film.

In the above mentioned structure of the superconducting device, for example, the first, second and third superconducting layers can function as a superconducting source electrode, a superconducting gate electrode and a superconducting drain electrode, respectively, and the fourth superconducting can constitute a superconducting channel.

Thus, the above mentioned superconducting device, namely, the superconducting channel-FET is such that the superconducting source electrode and the superconducting drain electrode are located in a vertical direction, and the superconducting channel connected between the superconducting source electrode and the superconducting drain electrode also extends in a vertical-direction. Accordingly, the above mentioned superconducting device forms a vertical type superconducting channel-FET, which can have a superconducting channel shorter than that of a so called planar type superconducting channel-FET, and therefore, can operate at a speed higher than the planar type superconducting channel-FET. In addition, the superconducting device of the vertical type can be integrated with a high integration density. Since the third superconducting layer can be easily made in common with that of other vertical type superconducting devices, planarization can be easily realized.

In one embodiment, the superconducting device have a silicon containing layer formed adjacent to the fourth superconducting layer, but not in direct contact with the first to third superconducting layer.

If the silicon containing layer is selectively heated if necessary, silicon is diffused into the fourth superconducting layer from the silicon containing layer, so that the oxide superconductor constituting the fourth superconducting layer loses its superconductivity, namely, becomes a non-superconductor. As a result, the superconducting device loses its function.

In another embodiment, the superconducting device have a silicon containing layer formed adjacent to the first and/or third superconducting layer, but not in direct contact with the others superconducting layers.

In this case, if the silicon containing layer is selectively heated, silicon is diffused into the first and/or third superconducting layer from the silicon containing layer, and therefore, the oxide superconductor constituting the first and/or third superconducting layer loses its superconductivity, namely, becomes a non-superconductor. As a result, the superconducting device loses its function, similarly to the above case.

Thus, in the above mentioned embodiments, it is possible to easily change the function of the superconducting device, and therefore, to modify a circuit including the superconducting device. For selectively heating the silicon containing layer, it is possible to use for example a laser beam, a focused ion beam, etc. In addition, the silicon containing layer can be formed of a noncrystalline silicon, a polycrystalline silicon, a silicide or any silicon containing compound.

In addition, the above mentioned first to fourth superconducting layers can function as a superconducting current path. Particularly, the second superconducting layer constituting the superconducting gate electrode can be used to function as a superconducting current path. Generally, the gate length is preferred to be made as short as possible for a high speed operation, and therefore, the superconducting gate electrode is preferred to be formed of an extremely thin superconductor film in the above mentioned superconducting device. Specifically, it is preferred that the superconducting gate electrode has a thickness of not greater than about 100 nm at its end in contact with the gate insulator. However, this extremely thin superconducting gate electrode is not suitable as an ordinary superconducting current path since a sectional area is too small.

In the superconducting device in accordance with the present invention, the second superconducting layer can be formed to be thin at its end portion in contact with the gate insulator, but thick at its portion sufficiently remote from the gate insulator, since the second superconducting layer extends in a horizontal direction, namely, along the deposition surface of the substrate. Therefore, the thick portion of the second superconducting layer can be used as a superconducting current path. For example, the second superconducting layer is formed to have a thickness of not greater than about 100 nm at its end portion in contact with the gate insulator, but a thickness of not less than about 200 nm at its portion remote from the gate insulator by about 300 nm.

Furthermore, since the first and third superconducting layers extend in parallel to the principal surface of the substrate, and at different heights from the principal surface of the substrate. Therefore, if the first and/or third superconducting layers are extended in a direction parallel to the principal surface of the substrate, the first and/or third superconducting layers can form a multilayered wiring pattern, similarly to multilayered wiring in recent semiconductor integrated circuit technique. Therefore, if the first and third superconducting layers are extended beyond a region in which the superconducting device is formed, the first and third superconducting layers can be used to flow, in a region other than the superconducting device region, a current other than the main current flowing through the superconducting channel. Therefore, the superconducting device is accordance with the present invention is suitable for increasing the integration density, and for simplifying the wiring in the integrated circuit.

In a preferred embodiment of the superconducting device in accordance with the present invention, the oxide superconductor thin films is formed of a high-Tc (high critical temperature) oxide superconductor material. This high-Tc oxide superconductor material has been studied by many researchers since the discovery of Bednorz and Müller in 1986, and is said to indicate an oxide superconductor material having a critical temperature of not less than 30K. More specifically, the oxide superconductor thin film is formed of a high-Tc copper-oxide type oxide superconductor material typified by a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate, on which the oxide superconductor thin film is deposited, can be formed of an insulating substrate, preferably an oxide single crystalline substrate such as MgO, $SrTiO_3$, and $CdNdAlO_4$. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer, or a single layer of "YSZ" (yttrium stabilized zirconia) or $Y_2O_3$ if a silicon substrate is used.

The above and other objects, features and advantages of the present invention will be apparent from the following description of preferred embodiments of the invention with reference to the accompanying drawings.

DESCRIPTION OF THE PREFERRED EMBODIMENT

Figure 1:
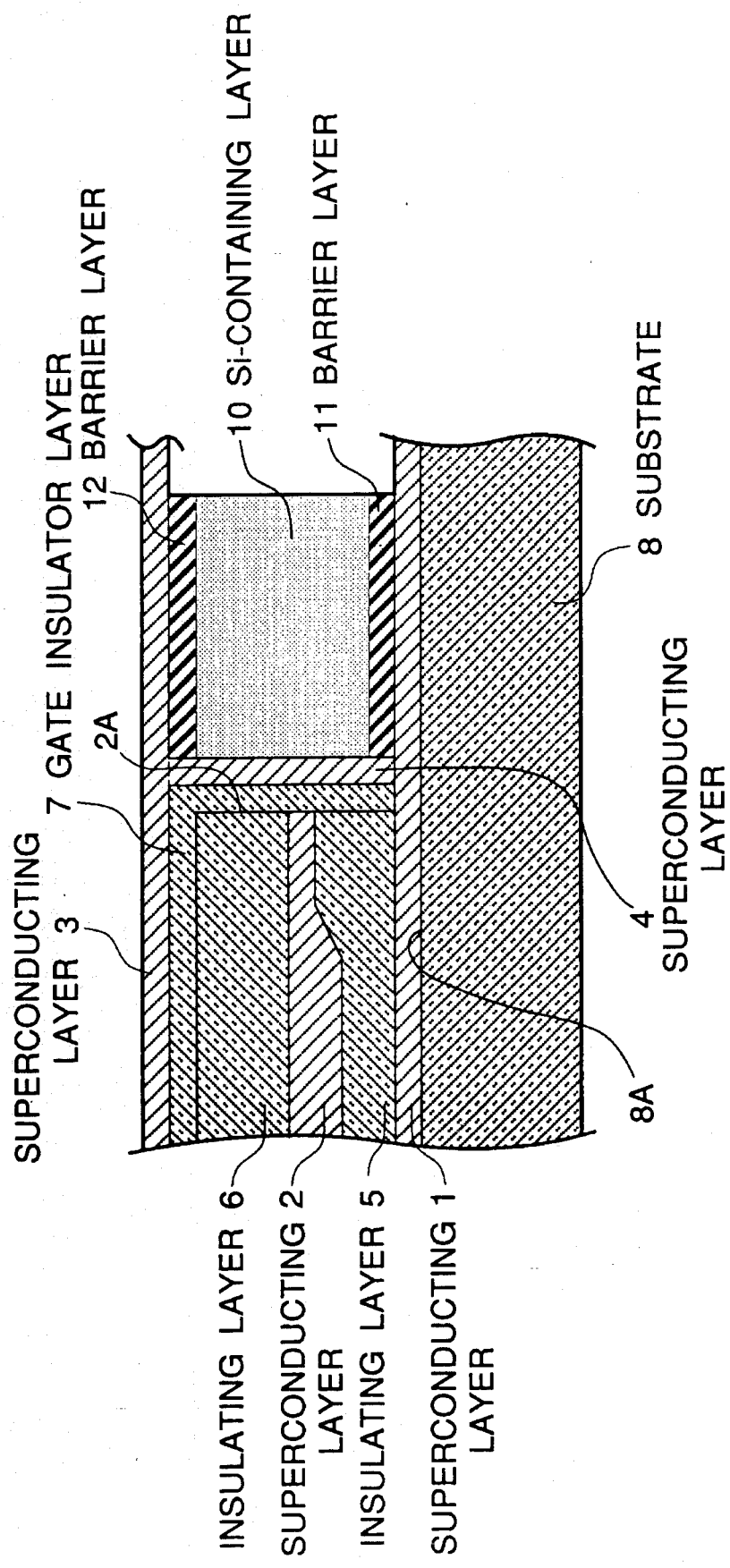
FIG. 1 is a diagrammatic sectional view of a first embodiment of the superconducting device in accordance with the present invention.

Referring to FIG. 1, there is shown a diagrammatic sectional view of a first embodiment of the superconducting device in accordance with the present invention.

The shown superconducting device is a superconducting channel-FET, which includes an insulating substrate 8, a first superconducting layer 1 deposited on the substrate 1, and a second superconducting layer 2 deposited through an insulating layer 5 on the first superconducting layer 1, and a third superconducting layer 3 deposited through an insulating layer 6 and a gate insulator layer 7 on the second superconducting layer 2. These first to third superconducting layers are formed of a c-axis oriented $Y_1Ba_2Cu_3O_{7-x}$ (0<x<1) oxide superconductor thin film. Each of the first and third superconducting layers has a thickness of about 200 nm, and the second superconducting layer has a thickness of about 100 nm in its end portion adjoining the gate insulator layer 7, and a thickness of about 200 nm at a position separated from the gate insulator layer 7 by about 300 nm. The c-axis orientated oxide superconductor thin film can be formed by for example an off-axis sputtering at a temperature of about 700° C.

The substrate 8 is formed of for example, an insulating substrate such as a MgO (100) substrate, a $CdNdAlO_4$ (001) substrate, a $SrTiO_3$ (100) substrate or others, or a semiconductor substrate such as a silicon (100) substrate having a principal surface coated with insulating films. However, if the silicon substrate is used, a principal surface of the silicon substrate is continuously coated with $MgAl_2O_4$ by a CVD process and with $BaTiO_3$ by a sputtering process.

As seen from FIG. 1, the stacked structure composed of the insulating layer 5, the second superconducting layer 2 and the insulating layer 6 has an flat end surface 2A perpendicular to a principal surface or deposition surface 8A of the substrate 8, and the gate insulator layer 7 extends to cover an upper surface of the insulating layer 6 and the end surface 2A.

In addition, the superconducting channel-FET includes a fourth superconducting layer 4 deposited to cover a portion of the gate insulator layer 7 on the end surface 2A and to vertically extend from the first superconducting layer 1 to the third superconducting layer 3 so as to electrically connect between the first superconducting layer 1 and the third superconducting layer 3, but to be electrically isolated from the second superconducting layer 2 by the gate insulator layer 7. This superconducting layer 4 is formed of an a-axis oriented $Y_1Ba_2Cu_3O_{7-x}$ oxide superconductor thin film and has a thickness of not greater than 5 nm. The a-axis orientated oxide superconductor thin film can be formed by for example an off-axis sputtering at a temperature of not greater than 650° C. Therefore, since the superconducting layer 4 has the a-axis perpendicular to the principal surface or deposition surface 8A of the substrate 8, the oxide superconductor thin film of the superconducting layer 4 deposited above the vertical end surface 2A has the a-axis in parallel to the vertical end surface and therefore has a large critical current density in a direction parallel to the vertical end surface 2A.

The insulating layers 5 and 6 and the gate insulator layer 7 are formed of, for example. MgO, $Si_3N_4$, etc., and in particular, the gate insulator layer 7 has a thickness sufficient to prevent a tunnel current, for example, a thickness of not less than 10 nanometers.

At a right-hand side (in the drawing) of the vertical superconducting layer 4, a silicon containing layer 10 is located, which is in direct contact with the vertical superconducting layer 4 but separated from the first and third superconducting layers 1 and 3 by a pair of barrier layers 11 and 12. The barrier layer 11 is formed between the first superconducting layer 1 and the silicon containing layer 10, and the barrier layer 12 is formed between the silicon containing layer 10 and the third superconducting layer 3. The silicon containing layer 10 is composed of a monocrystalline silicon, a polycrystalline silicon or different silicides. On the other hand, the barrier layers 11 and 12 are formed of a material such as Au, which does not react with the oxide superconductor material and can effectively prevent diffusion of the silicon.

In the above mentioned superconducting channel-FET, the first and third superconducting layers 1 and 3 constitute a superconducting source electrode and a superconducting drain electrode, and the second superconducting layer 2 forms a superconducting gate electrode. The fourth superconducting layer functions as a superconducting channel. Accordingly, a current flowing through the fourth superconducting layer 4 between the first and third superconducting layers 1 and 3 is controlled by a voltage applied to the second superconducting layer 2.

Namely, the superconducting source electrode and the superconducting drain electrode are arranged in a vertical direction, and the superconducting channel connecting the superconducting source electrode and the superconducting drain electrode is constructed to allow a current to flow in the vertical direction. Therefore, the shown superconducting channel-FET is a vertical type FET, and accordingly, can have a superconducting channel shorter than that of the planar type FET in which the superconducting source electrode and the superconducting drain electrode are arranged in a horizontal direction. Thus, the shown superconducting channel-FET can operate at a speed higher than the planar type FET.

Here, it should be understood that a superconducting channel indicates a portion a current flowing through which is controlled by the gate voltage, and therefore, has a length corresponding to a gate length. In the shown embodiment, the gate length is determined by the thickness of the end portion of the superconducting gate electrode 2 in contact with the gate insulator layer 7 (about 100 nm in the embodiment). Accordingly, the shown embodiment can have an extremely short superconducting channel.

In the shown embodiment, the end surface 2A is substantially perpendicular to the principal surface 8A of the substrate 8, namely to a plane of the superconducting gate electrode 2. However, the end surface 2A can be inclined to the principal surface 8A of the substrate 8, namely to the plane of the superconducting gate electrode 3, in an extent capable of ensuring the short superconducting channel.

In the superconducting channel-FET as mentioned above, if the silicon containing layer 10 is selectively heated, silicon is caused to diffuse into the fourth superconducting layer 4, so that the fourth superconducting layer 4 is converted into a non-superconducting condition, and therefore, a current no longer flows through the fourth layer 4. Namely, the superconducting channel-FET does not function.

The following is one typical condition for selectively heating the silicon containing layer 10 so as to cause silicon to diffuse into the fourth superconducting layer 4 so that the fourth superconducting layer 4 becomes a non-superconductor.

| Heating means | excimer laser (wavelength = 193 nm) |
| --- | --- |
| Irradiation output | 3.5 J/cm$^2$ (on the superconducting channel-FET) |
| Pulse rate | 2 Hz |
| Irradiation time | 15 minutes |

The silicon containing layer 10 was selectively heated under the above mentioned condition. As a result, the superconducting layer 4 did not show superconductivity at a temperature at which the superconducting layers 1 to 3 show superconductivity. The selective heating of the silicon containing layer 10 can be performed by not only the excimer laser, but also other means, for example, a focused ion beam.

Figure 2:
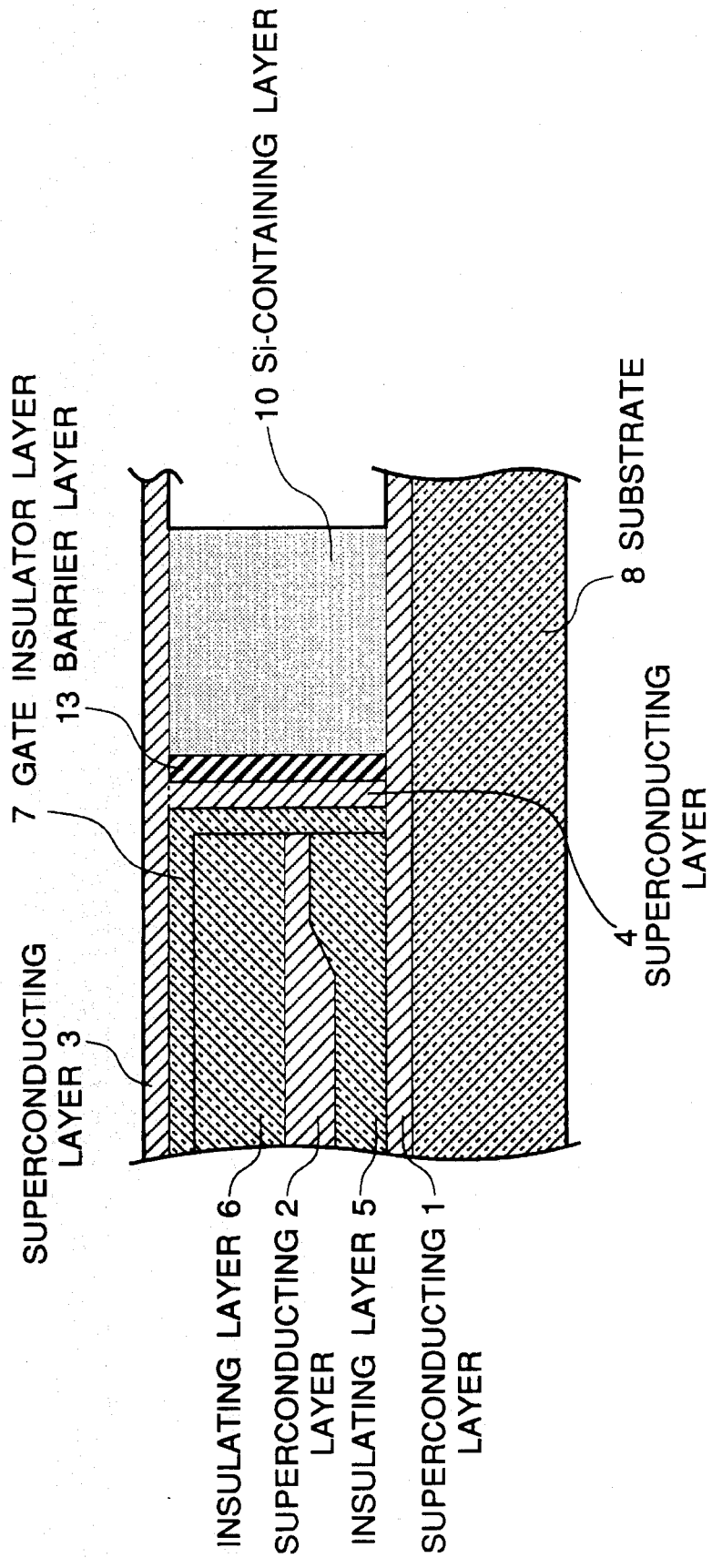
FIG. 2 is diagrammatic sectional view of a second embodiment of the superconducting device in accordance with the present invention.

Referring to FIG. 2, there is shown a diagrammatic sectional view of a second embodiment of the superconducting device in accordance with the present invention. In FIG. 2, elements similar to those shown in FIG. 1 are given the same Reference Numerals, and explanation thereof will be omitted.

As seen from comparison between FIGS. 1 and 2, the second embodiment has a barrier layer 13 in place of the pair of barrier layers 11 and 12. The barrier layer 13 is provided between the silicon containing layer 10 and the vertical superconducting layer 4, so that the vertical superconducting layer 4 is protected from the diffusion of silicon from the silicon containing layer 10. However, since the pair of barrier layers 11 and 12 are omitted, the silicon containing layer 10 is in direct contact with the first and third superconducting layers 1 and 3.

Therefore, if the silicon containing layer 10 is selectively heated, silicon is caused to diffuse into the first and third superconducting layers 1 and 3 in contact with the silicon containing layer 10, so that the first and third superconducting layers 1 and 3 are converted into a non-superconducting condition, and therefore, a current no longer flows through the first and third layers in contact with the silicon containing layer 10. In this connection, if diffusion silicon reaches into a connection portion between the first and fourth superconducting layers 1 and 4 and into a connection portion between the second and fourth superconducting layers 2 and 4, the current no longer flows through the fourth superconducting layer 4, and therefore, the superconducting channel-FET no longer functions.

The selective heating of the silicon containing layer 10 can be performed by the same condition as that of the first embodiment, and by the same means as that used in the first embodiment. In addition, one of the barrier layers 11 and 12 can used in combination with the barrier layer 13.

In the above mentioned two embodiments of the superconducting device, the second superconducting layer 2 constituting the superconducting gate electrode can be used to function as a superconducting current path. In the conventional superconducting device, the superconducting gate electrode has only the function of applying an electric field to the superconducting channel. However, in the superconducting device in accordance with the present invention, the second superconducting layer is formed to have a thickness of about 200 nm at its portion remote from the gate insulator by about 300 nm. The thick portion of the second superconducting layer can be used as a superconducting current path. Accordingly, if the superconducting device in accordance with the present invention is assembled in an integrated circuit, the second superconducting layer 2 constituting the superconducting gate electrode can be used as a superconducting current path. The thickness of the thick portion of the superconducting gate electrode used as a superconducting current path is not limited to this value of 200 nm, but can take any value if it is sufficient to form a superconducting current path. In other words, the thickness and the position of the thick portion of the superconducting gate electrode used as a superconducting current path can be freely selected if the thick portion does not give adversely superconducting channel.

Furthermore, the first and third superconducting layers extend (in the fight-hand direction in FIGS. 1 and 2) beyond a region in which the superconducting device is formed. Therefore, in a region other than the superconducting device region, it is possible to use the first superconducting layer 1 (forming the superconducting source electrode) so as to flow a current other than the main current flowing through the superconducting channel. In this connection, the third superconducting layer 3 (forming the superconducting drain electrode) can be used to flow a current other than the main current flowing through the superconducting channel. Therefore, the superconducting electrode which had been used as only the superconducting current path for the superconducting device can be used as a superconducting current path for the purpose other than the superconducting device.

As seen from the above, the superconducting current path in the superconducting device can be converted into non-superconductivity. Therefore, if it is desired to modify a circuit including a superconducting device, or if it becomes necessary to permanently break the function of the superconducting device, this request can be easily satisfied. Therefore, the superconducting device in accordance with the present invention is very effective for integration of the superconducting device.

In addition, the superconducting layers of the superconducting device can be utilized as a superconducting current path of the integrated circuit. Therefore, it is possible to realize a high integration density, since an extra wiring can be omitted. Furthermore, the structure of the superconducting device in accordance with the present invention is very simple and very effective for planarization of the device.

The invention has thus been shown and described with reference to the specific embodiments. However, it should be noted that the present invention is in no way limited to the details of the illustrated structures but changes and modifications may be made within the scope of the appended claims.

We claim:

1. A superconducting FET device comprising a stacked structure including:

a substrate, a first superconducting layer provided on the substrate, a first insulating layer provided on the first superconducting layer, a second superconducting layer provided on the first insulating layer, a second insulating layer provided on the second superconducting layer, a third superconducting layer provided on the second insulation layer, the stacked structure having an end surface extending from the first insulating layer to the second insulating layer, a fourth superconducting layer formed to cover the end surface of the stacked structure and, a third insulating layer which separates the stacked structure end surface and the fourth superconducting layer and prevents tunnel current therebetween, the fourth superconducting layer being in electric connection with the first and third superconducting layers and being isolated from the second superconducting layer by the third insulating layer, the first, second, third and fourth superconducting layers being formed with an oxide superconductor thin film wherein the first and third superconducting layers constitute a source and drain region, and the fourth superconducting layer constitutes a channel layer extending between the source and drain regions, and the second superconducting layer constitutes a gate electrode, whereby a current through the fourth superconducting layer between the first and the third superconducting layers is controlled by an electric field which is created by a voltage applied to the second superconductor layer and which acts on the fourth superconducting layer.

2. A superconducting device claimed in claim 1 further including a silicon containing layer located adjacent to the fourth superconducting layer, the silicon containing layer contacting the fourth superconducting layer, the fourth superconducting layer containing silicon diffused from the silicon containing layer, the first, second and third superconducting layers being isolated from contact with the silicon containing layer.

3. A superconducting device claimed in claim 2 wherein the silicon containing layer is formed of a material selected from the group consisting of a noncrystalline silicon, a polycrystalline silicon, and a silicide.

4. A superconducting device claimed in claim 1 further including a silicon containing layer located adjacent to at least one of the first and third superconducting layers, the silicon containing layer contacting said at least one of the first and third superconducting layers, said at least one of the first and third superconducting layers containing silicon diffused from the silicon containing layer, the silicon containing layer being isolated from contact with the second and the fourth superconducting layers.

5. A superconducting device claimed in claim 4 wherein the silicon containing layer is formed of a material selected from the group consisting of a noncrystalline silicon, a polycrystalline silicon, and a silicide 6. A superconducting device claimed in claim 1 wherein the second superconducting layer has a sufficiently small thickness at its end portion in contact with the third insulating layer to define a sufficiently short superconducting channel length, and a sufficiently large thickness at a portion sufficiently remote from the third insulating layer to function as a superconducting current path.

7. A superconducting device claimed in claim 6 wherein the end portion of the second superconducting layer which contacts with the third insulating layer has a thickness of not greater than about 100 nm, the remote portion thereof has a thickness of not less than about 200 nm and the remote portion is remote from the third insulating layer by at least about 300 nm.

8. A superconducting device claimed in claim 1 wherein at least one of the first and third superconducting layers extends beyond the other layers which form the stacked structure.

9. A superconducting device claimed in claim 1 wherein the first, second, third, and fourth superconducting layers are formed of a high-Tc oxide. superconductor material.

10. A superconducting device claimed in claim 9 wherein the first, second, third, and fourth superconducting layers are formed of a high-Tc copper-oxide type oxide superconductor material.

11. A superconducting device claimed in claim 10 wherein the first, second, third, and fourth superconducting layers are formed of the same material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

12. A superconducting device claimed in claim 1 wherein the substrate is formed of a material selected from the group consisting of a MgO (100) substrate, a $SrTiO_3$ (100) substrate and a $CdNdAlO_4$ (001) substrate, and a semiconductor substrate.

13. A superconducting device claimed in claim 1 wherein, in a direction parallel to current flow through the fourth superconducting layer, the first and third superconducting layers each have a thickness of about 200 nm, and the second superconducting layer has a thickness of about 100 nm at an end portion thereof which is adjacent the third insulating layer.

* * * * *